United States Patent
Hwang et al.

(10) Patent No.: US 8,104,666 B1
(45) Date of Patent: Jan. 31, 2012

(54) THERMAL COMPRESSIVE BONDING WITH SEPARATE DIE-ATTACH AND REFLOW PROCESSES

(75) Inventors: Chien Ling Hwang, Hsin-Chu (TW); Ying-Jui Huang, Taipei (TW); Cheng-Chung Lin, Taipei (TW); Chung-Shi Liu, Shin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/874,009

(22) Filed: Sep. 1, 2010

(51) Int. Cl.
*B23K 31/02* (2006.01)

(52) U.S. Cl. .................. 228/180.22; 228/234.1

(58) Field of Classification Search .................. None
See application file for complete search history.

(56) References Cited

U.S. PATENT DOCUMENTS

| | | | |
|---|---|---|---|
| 4,865,245 A | 9/1989 | Schulte et al. | |
| 4,878,611 A * | 11/1989 | LoVasco et al. | 228/180.22 |
| 5,148,968 A * | 9/1992 | Schmidt et al. | 228/180.22 |
| 5,244,142 A | 9/1993 | Nishiguchi et al. | |
| 5,346,857 A | 9/1994 | Scharr et al. | |
| 5,385,291 A * | 1/1995 | Latta | 228/180.22 |
| 5,439,161 A | 8/1995 | Kawatani et al. | |
| 5,441,195 A * | 8/1995 | Tustaniwskyj et al. | 228/180.22 |
| 5,611,481 A | 3/1997 | Akamatsu et al. | |
| 5,632,434 A | 5/1997 | Evans et al. | |
| 5,639,696 A * | 6/1997 | Liang et al. | 228/180.22 |
| 5,698,068 A | 12/1997 | Ichikawa et al. | |
| 5,745,986 A | 5/1998 | Variot et al. | |
| 5,964,396 A * | 10/1999 | Brofman et al. | 228/180.22 |
| 5,968,670 A * | 10/1999 | Brofman et al. | 428/576 |
| 5,975,409 A * | 11/1999 | Brofman et al. | 228/180.22 |
| 5,984,165 A | 11/1999 | Inoue et al. | |
| 6,131,795 A * | 10/2000 | Sato | 228/102 |
| 6,279,815 B1 | 8/2001 | Correia et al. | |
| 6,550,665 B1 | 4/2003 | Parrish et al. | |
| 6,796,481 B2 | 9/2004 | Yamauchi | |
| 6,890,795 B1 * | 5/2005 | Wong et al. | 438/114 |
| 7,165,711 B2 | 1/2007 | Barretto et al. | |
| 7,235,886 B1 | 6/2007 | Chandran et al. | |
| 7,257,887 B2 | 8/2007 | Lee | |
| 7,287,685 B2 | 10/2007 | Farooq et al. | |

(Continued)

FOREIGN PATENT DOCUMENTS

JP 02-206138 A * 8/1990

(Continued)

OTHER PUBLICATIONS

TDB-ACC-No. NN84081579, Aug. 1994.*

*Primary Examiner* — Kiley Stoner
(74) *Attorney, Agent, or Firm* — Slater & Matsil, L.L.P.

(57) ABSTRACT

A method of bonding includes providing a first work piece, and attaching a second work piece on the first work piece, with a solder bump disposed between the first and the second work pieces. The second work piece is heated using a heating head of a heating tool to melt the solder bump. After the step of heating the second work piece, one of the first and the second work pieces is allowed to move freely in a horizontal direction to self-align the first and the second work pieces. After the step of allowing one of the first and the second work pieces to move, a temperature of the heating head is lowed until the first solder bump solidifies to form a second solder bump.

18 Claims, 13 Drawing Sheets

U.S. PATENT DOCUMENTS

| | | |
|---|---|---|
| 7,299,965 B2 | 11/2007 | Sato |
| 7,455,213 B2 * | 11/2008 | Nishiyama ............... 228/180.22 |
| 7,569,939 B2 * | 8/2009 | Khandekar et al. ........... 257/778 |
| 7,699,210 B2 | 4/2010 | Suh |
| 7,731,077 B2 | 6/2010 | Farooq et al. |
| 2002/0109000 A1 * | 8/2002 | Rinne ........................... 228/102 |
| 2002/0140094 A1 * | 10/2002 | Kubota et al. ................. 257/737 |
| 2005/0035182 A1 | 2/2005 | Mano et al. |
| 2005/0061856 A1 | 3/2005 | Maki et al. |
| 2007/0000592 A1 | 1/2007 | Fares et al. |
| 2007/0099412 A1 * | 5/2007 | Miyazaki ..................... 438/612 |
| 2007/0108594 A1 * | 5/2007 | Ishii .............................. 257/704 |
| 2007/0287262 A1 | 12/2007 | Maki et al. |
| 2008/0035274 A1 | 2/2008 | Kanisawa |
| 2008/0158843 A1 * | 7/2008 | So et al. ........................ 361/808 |
| 2009/0008800 A1 * | 1/2009 | Nakatani et al. .............. 257/778 |
| 2009/0091025 A1 * | 4/2009 | Wong et al. ................... 257/737 |
| 2009/0125141 A1 | 5/2009 | Noda et al. |
| 2009/0126188 A1 | 5/2009 | Sakai et al. |
| 2009/0229853 A1 * | 9/2009 | Fukuda ....................... 174/126.1 |
| 2010/0288416 A1 | 11/2010 | Hamazaki |

FOREIGN PATENT DOCUMENTS

| | | | |
|---|---|---|---|
| JP | 10-223693 A | * | 8/1998 |
| JP | 2002-2649 A | | 1/2002 |
| JP | 5-190601 A | | 7/2005 |

* cited by examiner

THERMAL COMPRESSIVE BONDING WITH SEPARATE DIE-ATTACH AND REFLOW PROCESSES

CROSS-REFERENCE TO RELATED APPLICATION

This application relates to the following commonly-assigned U.S. patent application: application Ser. No. 12/841,858, filed Jul. 22, 2010, and entitled "Thermal Compress Bonding," which application is hereby incorporated herein by reference.

BACKGROUND

Integrated circuits are formed on semiconductor wafers, which are then sawed into semiconductor chips. The semiconductor chips may be bonded onto package substrates. During the bonding process, the solder bumps between the semiconductor chips and the package substrates are reflowed. Conventional reflow methods include convection-type reflow and thermal compressive reflow. The convection-type reflow has relatively high throughput since a plurality of package substrates and the overlying dies may be bonded through the reflow at the same time. However, the convection-type reflow requires a long period of time to heat solder bumps. The resulting high thermal budget may cause significant warpage in the dies, and may possibly cause delamination between low-k dielectric layers.

The thermal compressive bonding requires a lower thermal budget than the convection-type reflow. However, the thermal compressive bonding has a very low throughput. During the thermal compressive bonding, a bond head picks up a die, flips the die, and attaches the die to a package substrate. The bond head then goes through a temperature ramp-up process to heat the die and the solder bumps that join the die and the package substrate. After the solder bumps are melted, the bond head goes through a cool-down process so that the solder bumps solidify. This process is repeated for each of the dies, and hence the throughput of the thermal compressive bonding is very low, which sometimes may be only 1/15 of the throughput of the convection-type reflow.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel thermal compressive bonding (TCB) process, sometimes known as thermal compression bonding process, is provided. The intermediate stages of various embodiments are illustrated. Variations of the embodiments are also illustrated. Throughout the various views and illustrative embodiments, like reference numbers are used to designate like elements.

Figure 1:
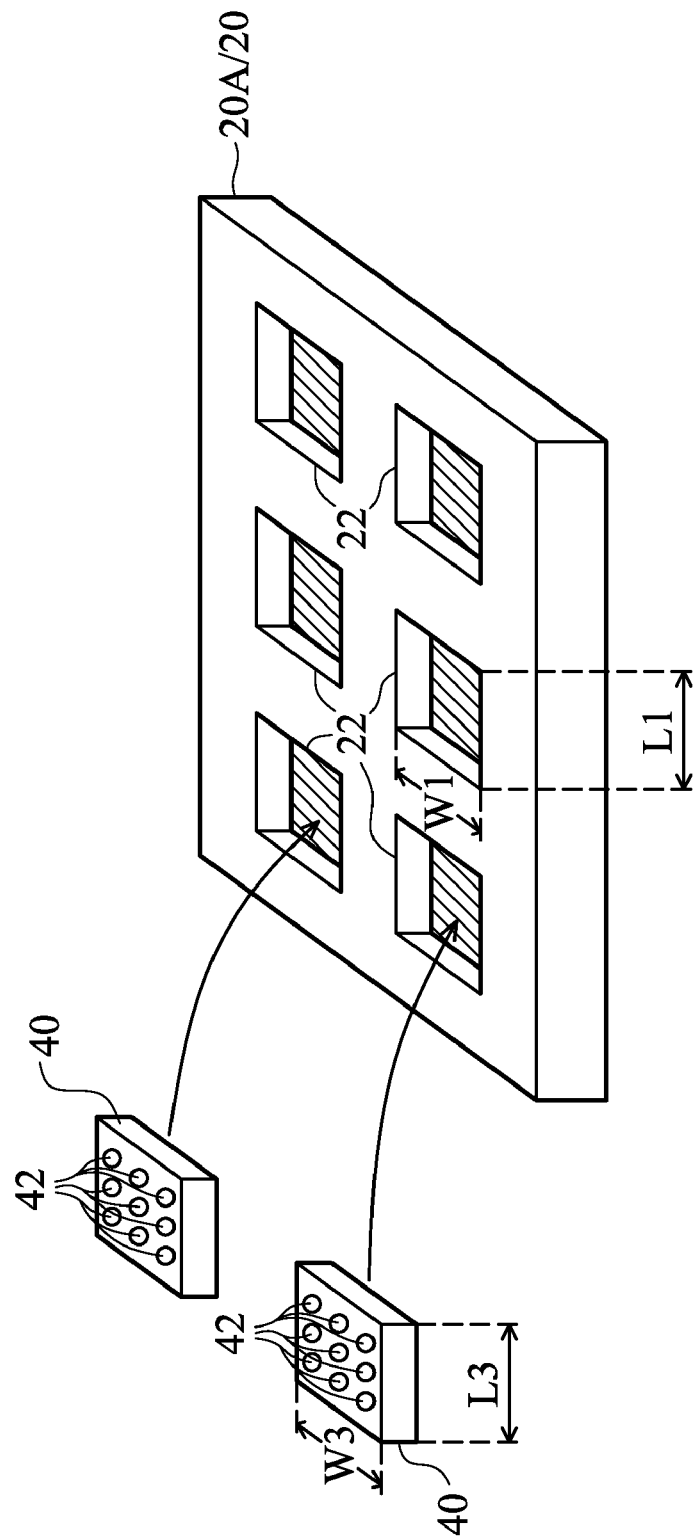
FIGS. 1 and 2 illustrate perspective views of a body and a cover of a jig-type substrate carrier.
Figure 2:
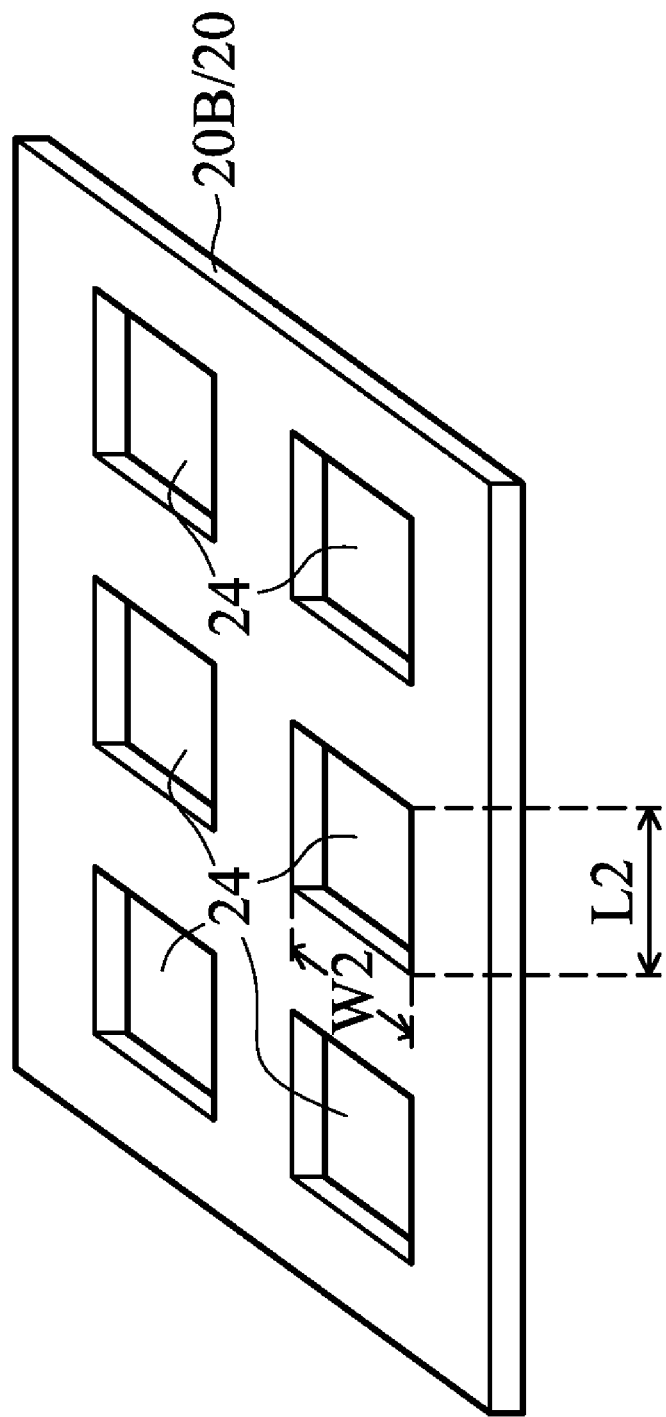

FIGS. 1 and 2 illustrate a body and a cover of jig-type substrate carrier 20. Referring to FIG. 1, body 20A of jig-type substrate carrier 20 includes a plurality of work piece holders 22, which may be arranged as an array having a plurality of rows and a plurality of columns. Although FIG. 1 only illustrates work piece holders 22 as a 2×3 array, substrate carrier 20 may have any number of rows and columns of work piece holders. Work piece holders 22 may include portions of body 20A that form the sidewalls and bottoms of holes, in which work pieces may be placed.

Referring to FIG. 2, cover 20B of jig-type substrate carrier 20 is provided. Cover 20B also includes a plurality of openings 24. Cover 20B can be secured on body 20A so that cover 20B and body 20A can be transported and used as an integrated unit. When cover 20B is secured on body 20A, each of the openings 24 is directly over one of work piece holders 22. Further, length L1 and width W1 of body 20A (FIG. 1) are greater than the respective length L2 and width W2 of cover 20B, so that after cover 20B is placed on body 20A, the edge portions of each of work piece holders 22 are covered by portions of cover 20B, while the center portion of each of work piece holders 22 is not covered.

Referring back to FIG. 1, a plurality of work pieces 40 is placed into work piece holders 22, with each of work piece holders 22 holding one work piece 40. In an embodiment, work pieces 40 are package substrates or interposers, which do not have active devices such as transistors therein. In alternative embodiments, work pieces 40 are device dies having active devices, such as transistors (not shown) therein. Throughout the description, work pieces 40 are alternatively referred to as (package) substrates 40 although they can also be other types of work pieces. Metal bumps 42 are formed on the top surfaces of substrates 40. Length L3 and width W3 of substrates 40 are smaller than the respective length L1 and width W1 of work piece holders 22. Furthermore, at least one, and possibly both, of length L3 and width W3 of substrates 40 are greater than the respective length L2 and W2 of openings 24 of cover 20B.

Figure 3:
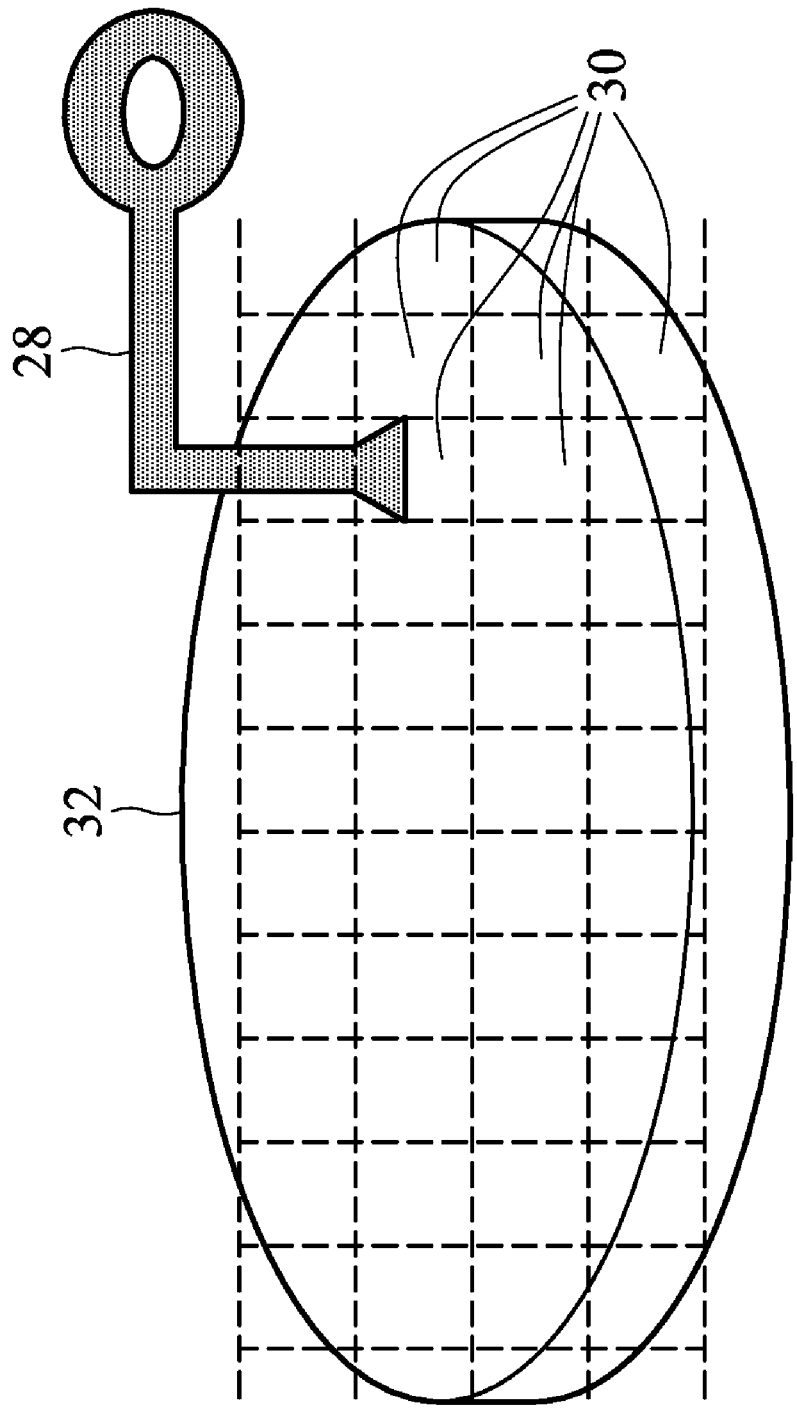
FIG. 3 illustrates a die-attach head picking up a die.

Referring to FIG. 3, die-attach head 28 is used to pick up work pieces 30, which may also be device dies, interposers, package substrates, or the like. Throughout the description, work pieces 30 are also referred to as dies 30, although they can also be other types of work pieces. Dies 30 may be sawed from a wafer as schematically illustrated as wafer 32, although dies 30 may be placed in a die tray (not shown), and hence die-attach head 28 picks up dies 30 from the die tray. Die-attach head 28 is configured to use a vacuum to pick up die 30, and to dip solder bumps 34 (not shown in FIG. 3, please refer to FIG. 4) that are on the surfaces of dies 30 in flux. Die-attach head 28 is a part of a tool module (referred to as a die-attach module hereinafter) for performing the die-attaching process.

Figure 4:
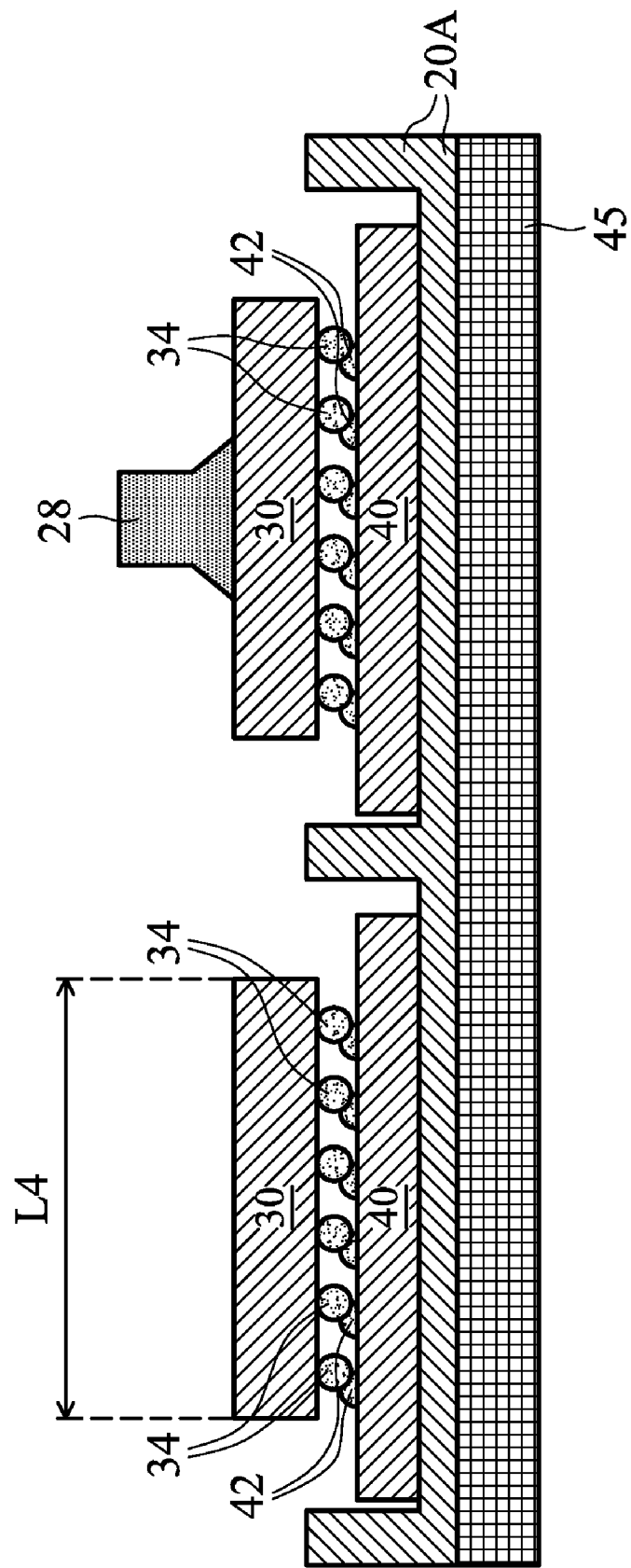
FIG. 4 illustrates the process of attaching a die onto a package substrate, wherein the package substrate is located in a work piece holder in the jig-type substrate carrier.

FIG. 4 illustrates the die-attaching of die 30 onto substrate 40 using compressive placement, which is also performed using die-attach head 28. During the die-attaching, body 20A of jig-type substrate carrier 20 may be placed on, and possibly secured onto, platform 45, for example, using a vacuum. Platform 45 is also a part of the die-attach module. After the die-attaching, solder bumps 34 are in contact with metal bumps 42 of substrate 40. Although bumps 34 are referred to as solder bumps, they may also be non-reflowable metal bumps such as copper pillar bumps. However, at least one type of bumps 34 and 42, and possibly both, are solder bumps. Accordingly, the solder bumps that are located between dies 30 and substrate 40 are referred to as solder bumps 34/42 hereinafter. To finish the die-attaching, die-attach head 28 applies a downward force, for example, less than about 5 NT, so that solder bumps 34 may stick to metal bumps 42. Die-attach head 28 may repeat the process of picking, flux-dipping, and compressive placement of dies 30 until all of substrates 40 have dies 30 placed thereon.

During the die-attaching, die-attach head 28 may be at a low temperature, which is lower than about 50° C., for example, and may be at room temperature. After the die-attaching of dies 30, cover 20B is placed on and secured on body 20A (refer to FIG. 5B), and hence jig-type substrate carrier 20, substrates 40, and dies 30 form an integrated part, and may be transferred away from the die-attach module, so that solder bumps 34/42 may be reflowed. It is observed that the horizontal length L4 and width W4 (W4 is not shown in FIG. 4, please refer to FIG. 10) of dies 30 are smaller than the respective dimensions L2 and W2 of openings 24 in FIG. 2. Accordingly, cover 20B may be placed on body 20A even if dies 30 have already been attached onto substrates 40.

Figure 5A:
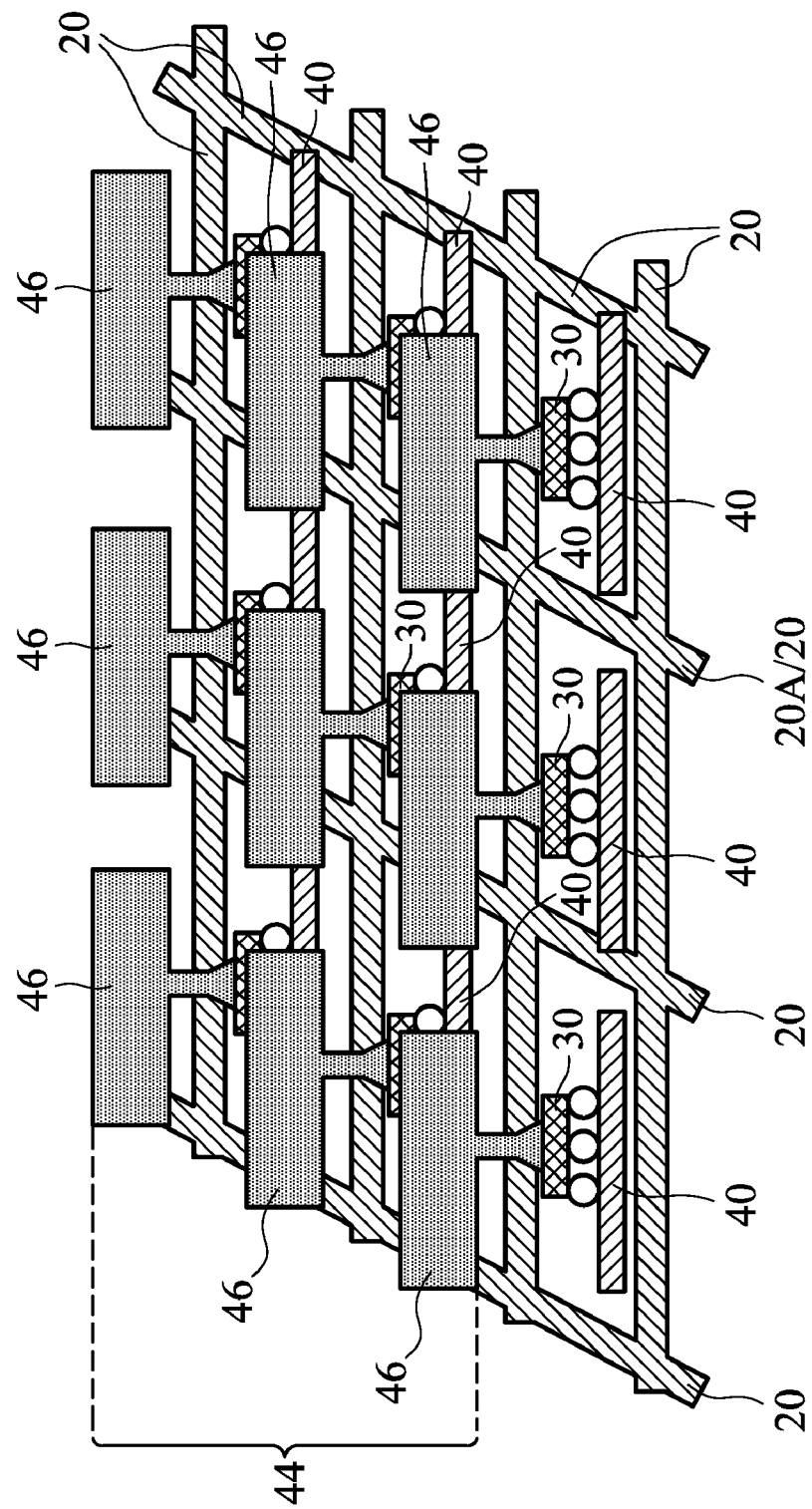
FIGS. 5A and 5B illustrate a perspective view and a cross-sectional view in the reflowing of solder bumps between dies and package substrates, wherein a multi-head heating tool is used for heating the solder bumps.
Figure 5B:
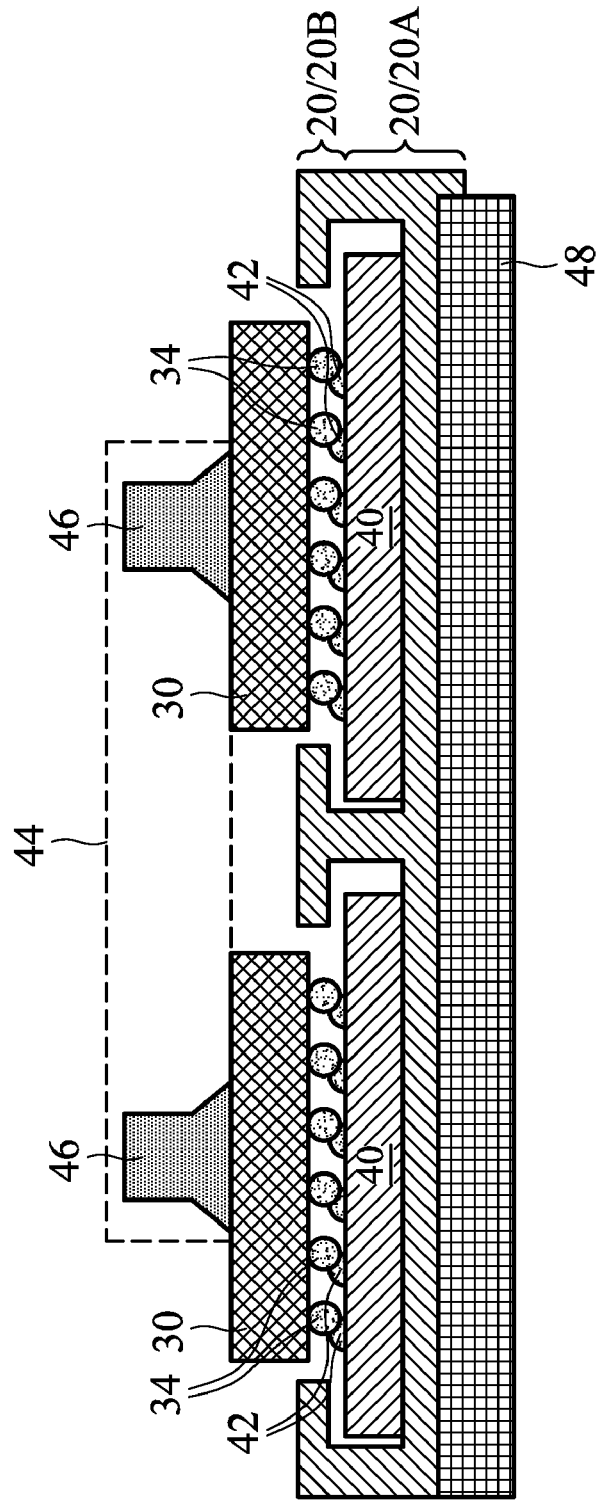

FIGS. 5A and 5B illustrate a perspective view and a cross-sectional view, respectively, of the reflow of solder bumps 34/42. Jig-type substrate carrier 20 may be placed on platform 48 (FIG. 5B) that can secure jig-type substrate carrier 20 using a vacuum. Further, platform 48 may pre-heat substrate 40 before the subsequent reflow process, for example, to a temperature lower than 100° C. Next, as shown in FIG. 5A, a plurality of heating heads 46, which are parts of multi-head heating tool 44, contact the top surfaces of dies 30, with each of heating heads 46 contacting one of dies 30. As shown in FIG. 5B, heating heads 46 heat dies 30 until solder bumps 34/42 are melted.

Figure 6:
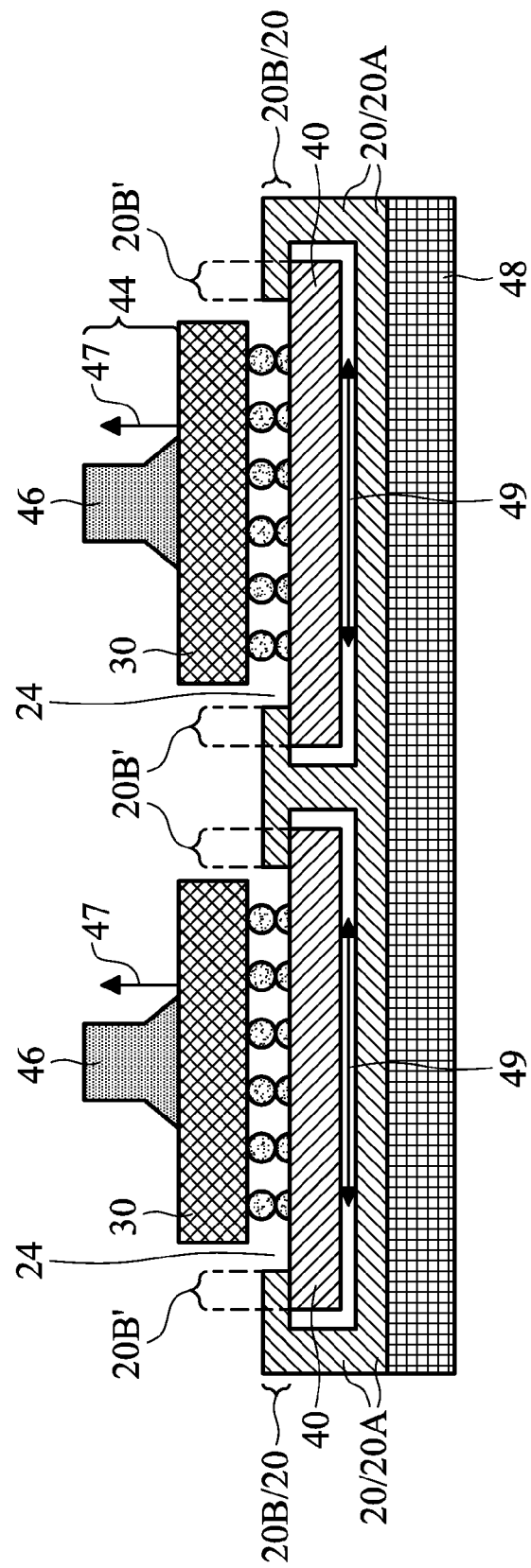
FIG. 6 illustrates that dies are lifted up by the heating tool.

Next, as shown in FIG. 6, heating heads 46, which also have the ability to pickup dies 30 using a vacuum, lift up dies 30, as symbolized by arrows 47. With the surface tension of the melted solder bumps 34/42, substrates 40 are also lifted up. During the lifting process, substrates 40 hang freely under the respective dies 30, and are free to move along horizontal directions, as symbolized by arrows 49. Accordingly, substrates 40 are self-aligned to the respective overlying dies 30. Since length L3 and/or width W3 (FIG. 1) of substrates 40 are greater than the respective length L2 and/or width W2 of openings 24 (FIG. 2), substrate 40 are blocked by portions of cover 20B, which portions are referred to as blocking arms 20B' hereinafter. Blocking arms 20B' are directly over and overlap edge portions of the respective substrates 40. The lift-up distance of dies 30 is adjusted so that after substrates 40 are blocked by cover 20B, dies 30 may continued to be lifted up slightly, and the melted solder bumps 34/42 may be stretched in the vertical direction. As a result, the height of the melted solder bumps 34/42 is adjusted, and the likelihood of bridging between neighboring solder bumps 34/42 is reduced. The temperature of heating heads 46 may then be reduced to below the melting temperature of solder bumps 34/42, and hence the melted solder bumps 34/42 solidify. Heating heads 46 then release the respective dies 30.

Figure 7:
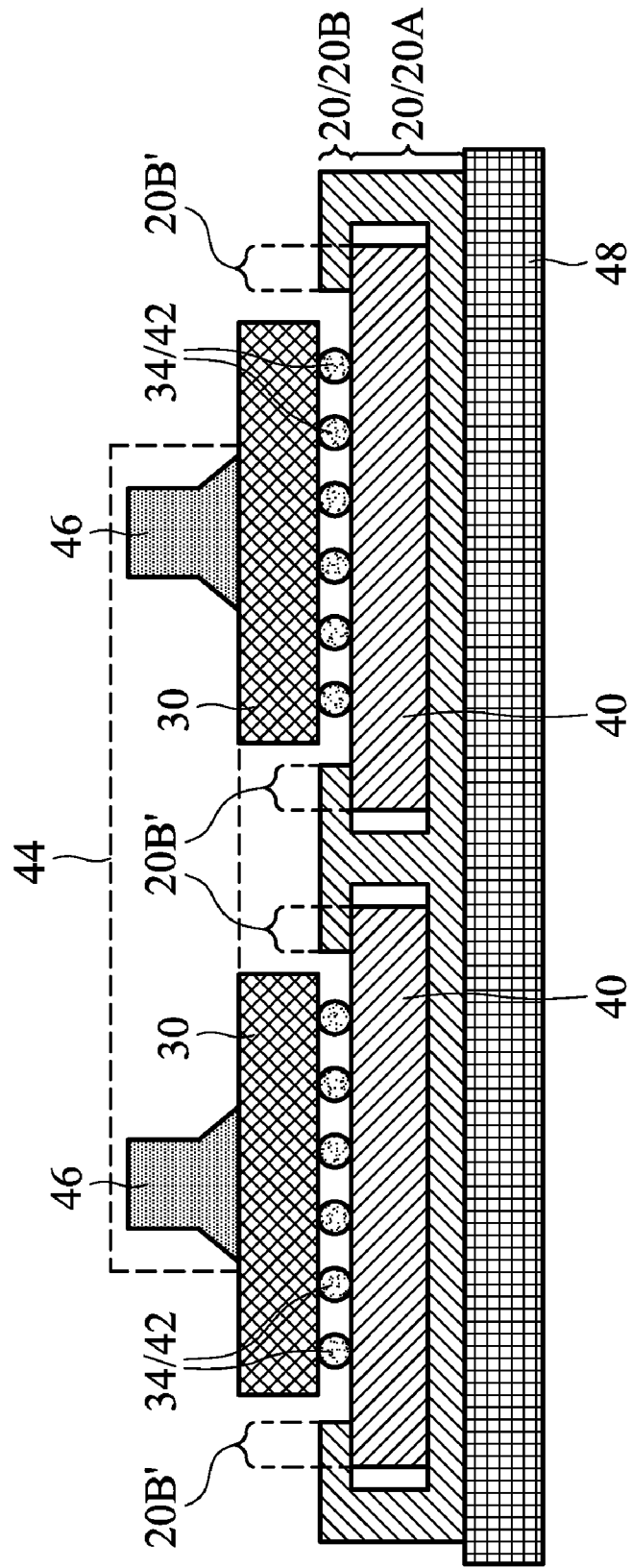
FIGS. 7 through 9 illustrate cross-sectional views of intermediate stages in the reflowing of solder bumps between dies and package substrates in accordance with alternative embodiments.
Figure 8:
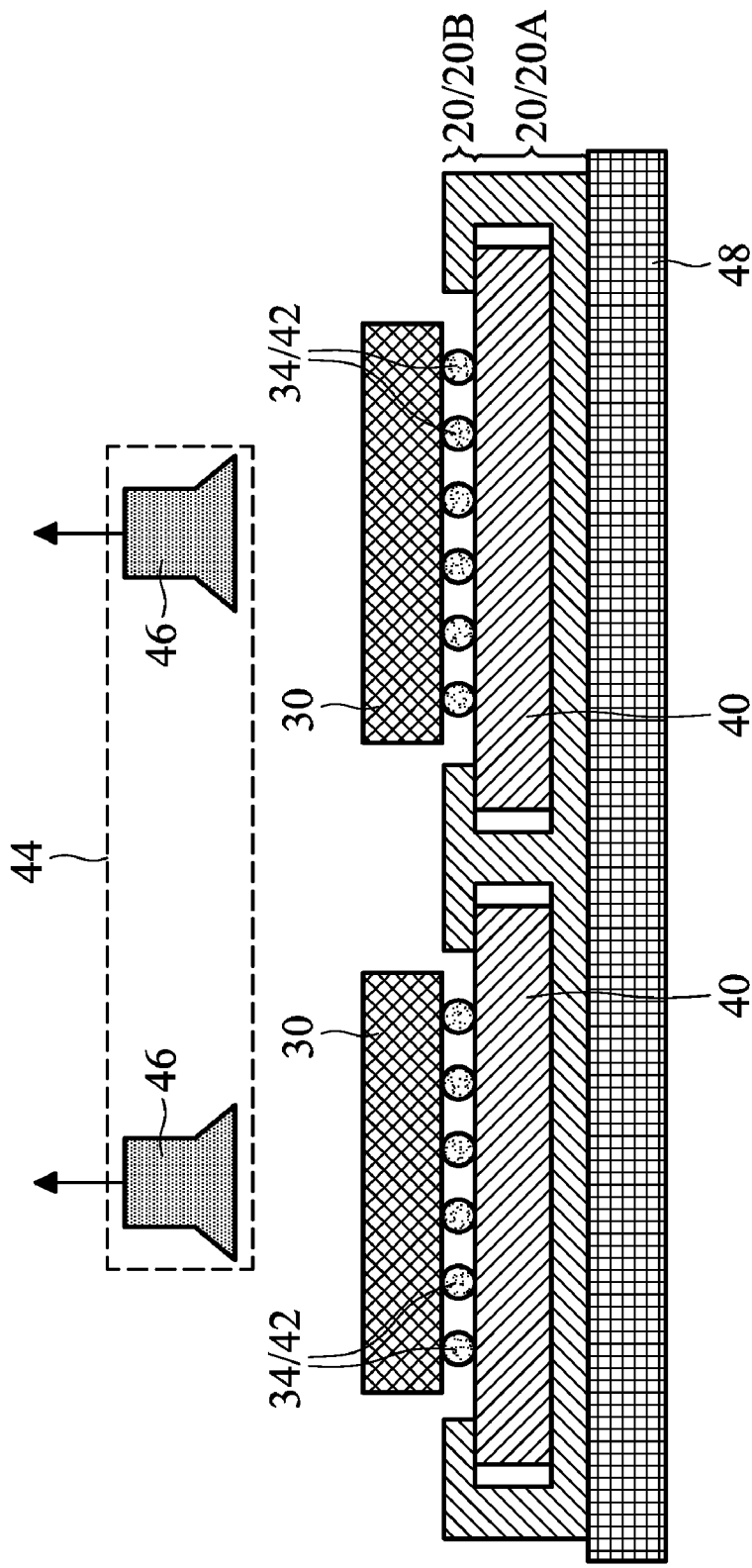
Figure 9:
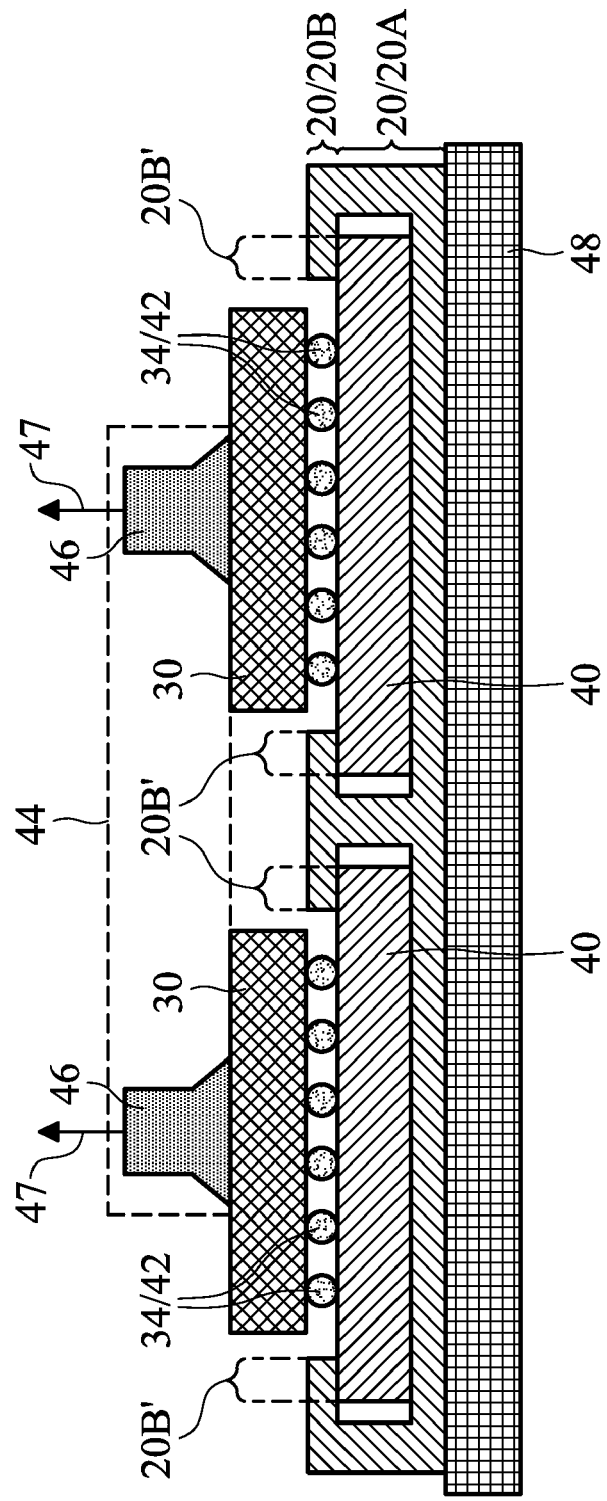

FIGS. 7 through 9 illustrate cross-sectional views of intermediate stages in the reflow of solder bumps between dies and package substrates in accordance with alternative embodiments. Unless specified otherwise, the reference numerals in these embodiments represent like elements in the embodiments illustrated in FIGS. 1 through 6. The initial steps of these embodiments are essentially the same as shown in FIGS. 1 through 5A. FIG. 7 illustrates a cross-sectional view of a portion of the structure after cover 20B has been placed on body 20A of jig-type substrate carrier 20. The thickness of body 20A of jig-type substrate carrier 20 is selected so that the bottom of blocking arm 20B' contact edge portions of the top surface of substrates 40, and hence substrates 40 are fixed in position, and is not able to move vertically and horizontally. Platform 48 may be used to pre-heat substrate 40 before the subsequent reflow process, for example, to a temperature lower than 100° C.

The plurality of heating heads 46 of multi-head heating tool 44 contacts, the top surfaces of dies 30, with each of heating heads 46 contacting one of dies 30. Heating heads 46 heat dies, so that solder bumps 34/42 are melted.

Next, referring to FIG. 8, heating heads 46 release the respective underlying dies 30, for example, by releasing vacuum. Further, heating heads 46 may be lifted up, and are not in contact with dies 30 for a short period of time. In an exemplary embodiment, this period of time is between about 1 second and 2 seconds. In other embodiments, this period of time is between about 0.5 second and about 4 seconds. During this period of time, substrates 40 are still secured in position by blocking arms 20B'. However, since solder bumps 34/42 are in a liquid state, dies 30 are free to move slightly horizontally and vertically. Accordingly, with the ability to move in the horizontal directions, dies 30 are self-aligned with the respective underlying substrates 40.

Next, as shown in FIG. 9, heating heads 46 are placed in contact with dies 30 again, and then lift up dies 30 slightly, as also symbolized by arrows 47. In these embodiments, substrates 40 are not allowed to move freely along horizontal and/or vertical directions due to blocking arms 20B' that hold substrates 40 in position. The lift-up distance of dies 30 is adjusted so that the height of the melted solder bumps 34/42 is adjusted to a desirable value, and the likelihood of bridging between neighboring solder bumps 34/42 is reduced. The temperature of heating heads 46 may then be reduced to below the melting temperature of solder bumps 34/42, and hence the melted solder bumps 34/42 solidify. Heating heads 46 then release the respective dies 30.

In an embodiment, the reflow is performed by a reflow module, which includes multi-head heating tool 44 and platform 48. In an embodiment, the die-attach module for performing the die-attaching (FIG. 4) and the reflow module for performing the reflow (FIGS. 5A through 9) are separate tool modules belonging to a same TCB tool. Alternatively, the die-attach module and the reflow module belong to separate tools.

Figure 10:
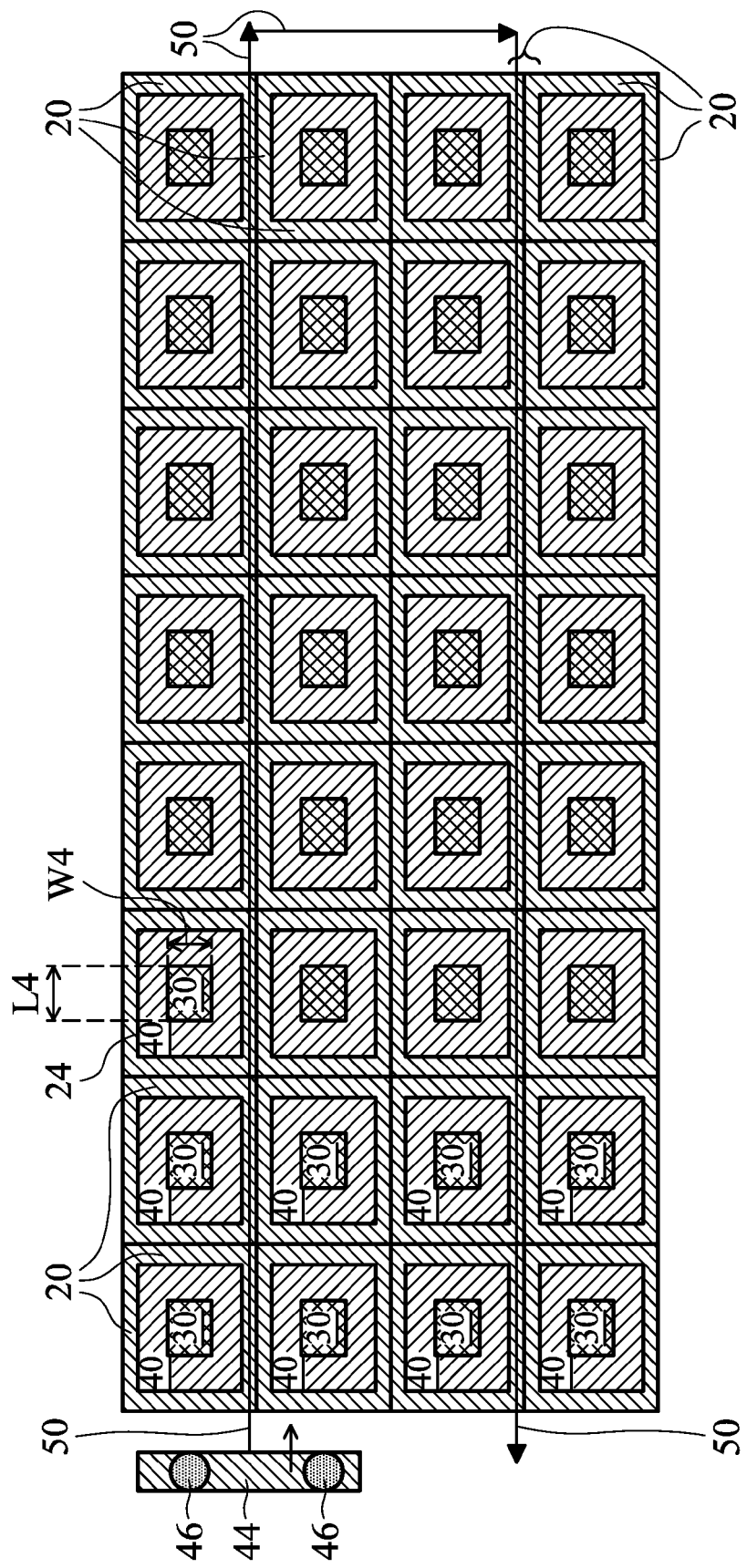
FIGS. 10 and 11 illustrate the reflowing of the solder bumps using a two-head heating tool and a four-head heating tool, respectively.
Figure 11:
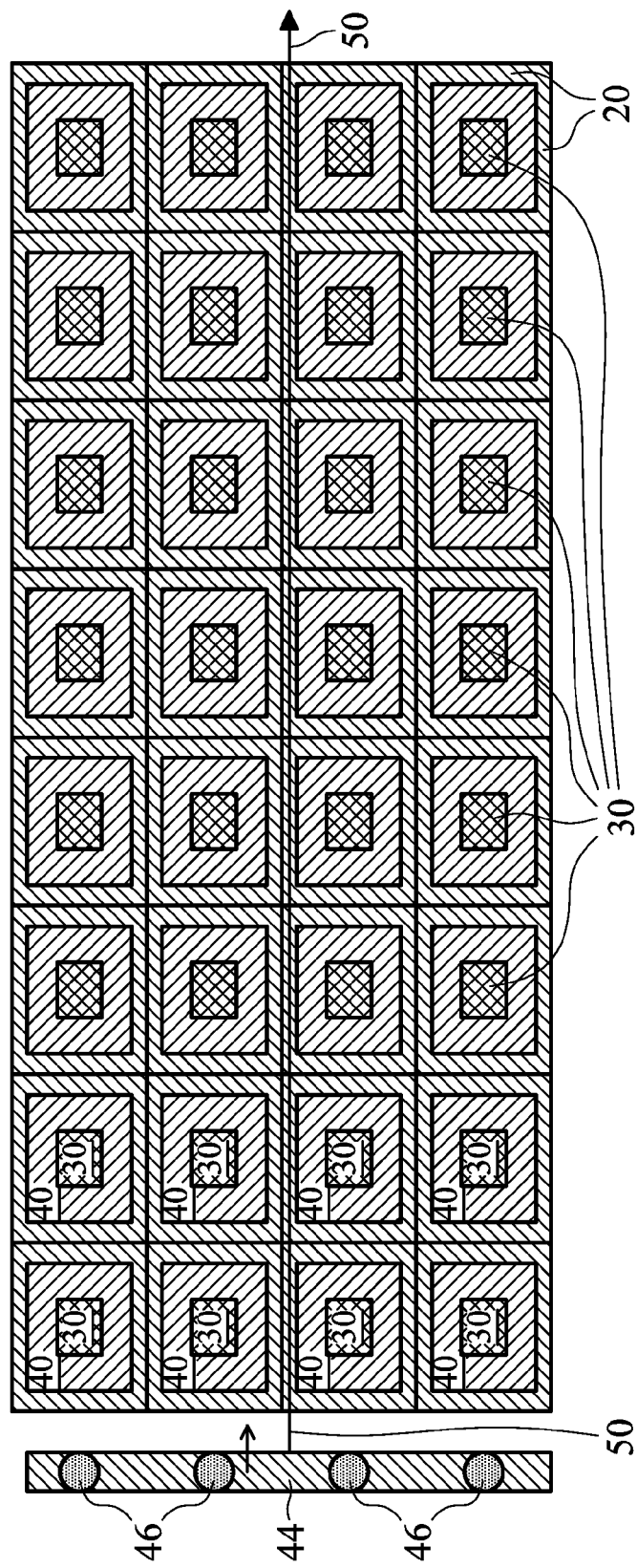

FIGS. 10 and 11 illustrate two reflow processes performed using multi-head heating tool 44. Referring to FIG. 10, multi-head heating tool 44 includes two heating heads 46, and hence may perform bonding for two dies 30 at a time. After the bonding of two dies 30 is finished, multi-head heating tool 44 may move to the next two dies 30 to perform reflow. Arrows 50 illustrate a likely path on which multi-head heating tool 44 moves. In FIG. 11, multi-head heating tool 44 has four heating heads 46, and hence may perform bonding for four dies 30 at a time. After the bonding of four dies 30 is finished, multi-head heating tool 44 may move to the next four dies 30. Similarly, arrow 50 illustrates a likely path on which multi-head heating tool 44 moves. In the exemplary embodiments as shown in FIGS. 10 and 11, the total number of work piece holders in jig-type substrate carrier 20 is 32. Accordingly, the number of heating heads 46 in multi-head heating tool 44 may be as great as 32, and as small as 2, or may be equal to any other applicable number, such as 2, 4, 8, 12, and 16.

Figure 12:
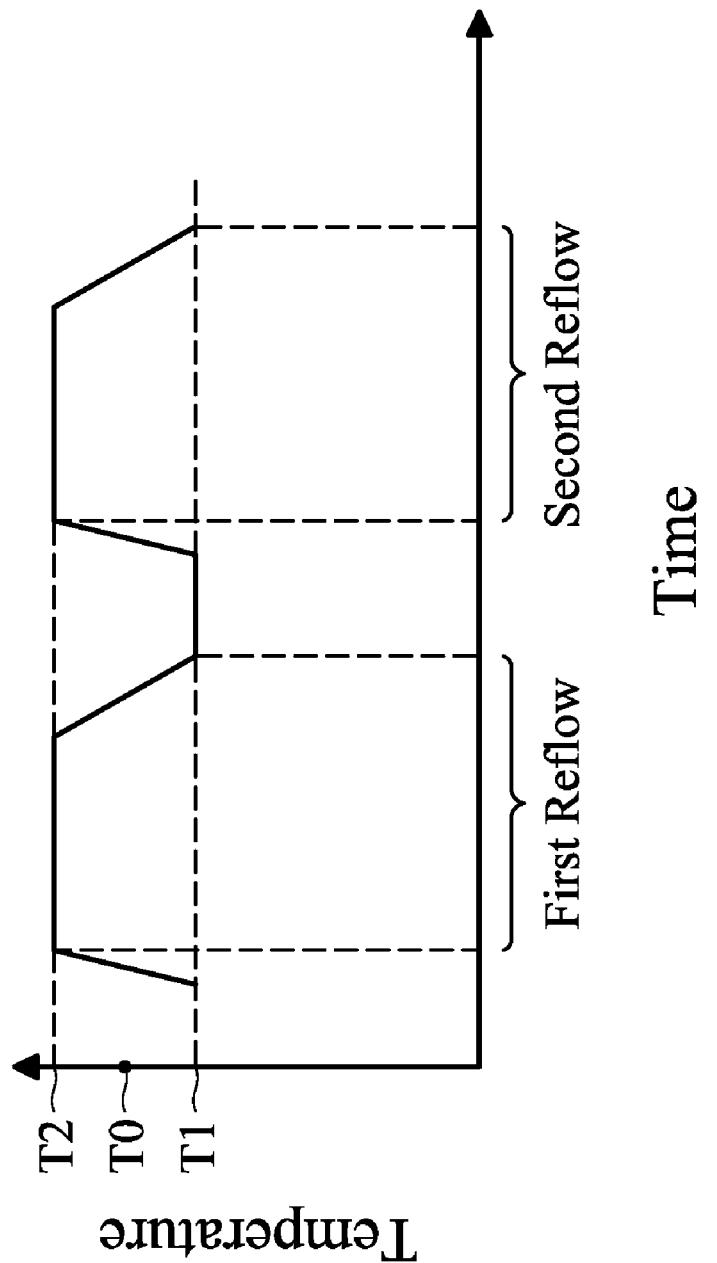
FIG. 12 illustrates a schematic temperature profile of heating heads in the multi-head heating tool.

Since heating heads 46 (FIGS. 5A and 5B) do not perform the task of picking and placing dies 30, the temperature of heating heads 46 may be maintained at high temperatures. For example, FIG. 12 schematically illustrates a temperature profile of heating heads 46. In the beginning of a first reflow process, heating heads 46 are at temperature T1, which is higher than room temperature, and may be higher than about 150° C., or even greater than about 180° C. Temperature T1 is also lower than the melting temperature T0 of solder bumps 34/42, which may be about 220° C. to about 260° C., for example. During the first reflow process, the temperature of heating heads 46 ramps up to temperature T2, which is higher than temperature T0 and is high enough to cause the melting of solder bumps 34/42. After the reflow process, the temperature of heating heads 46 is lowered, for example, back to temperature T1, or even lower. The temperature profile in the first reflow may be repeated for the second reflow process and additional reflow processes. Maintaining heating heads 46 at high temperatures may reduce the temperatures' ramp-up time and cool-down time, and hence can also results in the improvement in the throughput of the TCB process. In alternative embodiments, after the first reflow process, the temperature of heating heads 46 may also return back to a low temperature, for example, close to room temperature.

By separating the die-attaching and the reflow processes to two separate tool modules, the throughput of the TCB bonding may be improved. Further, the use of a multi-head heating tool results in further improvement in the throughput. The jig-type substrate carrier makes the horizontal movement of substrates possible, and with the self-alignment, the accuracy of the alignment between dies and substrates is improved.

In accordance with embodiments, a method of bonding includes providing a first work piece, and attaching a second work piece on the first work piece, with a solder bump disposed between the first and the second work pieces. The second work piece is heated using a heating head of a heating tool to melt the solder bump. After the step of heating the second work piece, one of the first and the second work pieces is allowed to move freely in a horizontal direction to self-align the first and the second work pieces. After the step of allowing one of the first and the second work pieces to move, a temperature of the heating head is lowed until the first solder bump solidifies to form a second solder bump.

In accordance with other embodiments, a method includes providing a jig-type substrate carrier including a plurality of work piece holders; placing a plurality of first work pieces into the plurality of work piece holders, wherein edge portions of the plurality of first work pieces are directly under and vertically overlap blocking arms of the jig-type substrate carrier; and placing a plurality of second work pieces over the plurality of first work pieces, with solder bumps joining the plurality of second work pieces to the plurality of first work pieces. The method further includes reflowing the solder bumps. Further, after the solder bumps melt, the plurality of second work pieces is lifted up with the solder bumps in a melting state, wherein the plurality of first work pieces is lifted up to hang under the plurality of second work pieces, and wherein the jig-type substrate carrier is not lifted up. A temperature of the solder bumps is then lowered to below a melting temperature of the solder bumps.

In accordance with yet other embodiments, a method includes providing a body of a jig-type substrate carrier comprising a plurality of work piece holders; placing a plurality of first work pieces into the plurality of work piece holders; attaching a plurality of second work pieces onto the plurality of first work pieces, with solder bumps joining the plurality of second work pieces to the plurality of first work pieces; placing a cover of the jig-type substrate carrier onto the body of the jig-type substrate carrier, wherein the cover comprises blocking arms extending directly over, and contacting, edges of the plurality of first work pieces; placing a plurality of heating heads over, and reflowing, the solder bumps, wherein each of the plurality of heating heads contacts one of the plurality of second work pieces; reflowing the solder bumps by using the plurality of heating heads to heat the solder bumps; after the solder bumps melt, releasing the plurality of second work pieces from the plurality of heating heads; and after the step of releasing, lifting up the plurality of second work pieces using the plurality of heating heads, with the solder bumps in a melted state In accordance with yet other embodiments, a method includes providing a body of a jig-type substrate carrier comprising a plurality of work piece holders; placing a plurality of first work pieces into the plurality of work piece holders; attaching a plurality of second work pieces onto the plurality of first work pieces using a first tool module, with solder bumps joining the plurality of second work pieces to the plurality of first work pieces; placing a cover of the jig-type substrate carrier onto the body of the jig-type substrate carrier; transferring the jig-type substrate carrier and the plurality of first and the second work pieces to a second tool module; and reflowing the solder bumps using a plurality of heating heads of a multi-head heating tool, with the plurality of heating heads contacting the plurality of second work pieces. The multi-head heating tool is comprised in the second tool module.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
providing a first work piece;
attaching a second work piece on the first work piece, with a first solder bump between the first and the second work pieces;
heating the second work piece using a heating head of a heating tool to melt the first solder bump;
after the step of heating the second work piece, allowing one of the first and the second work pieces to move freely in a horizontal direction to self-align the first and the second work pieces, wherein the step of allowing one of the first and the second work pieces to move comprises:
 releasing the second work piece from the heating head; and
 after the step of releasing the second work piece, lifting the second work piece up using the heating head, with the first solder bump being melted during the step of lifting, and wherein the first work piece is fixed in position and does not move along with the second work piece; and
after the step of lifting the second work piece, lowering a temperature of the heating head until the first solder bump solidifies to form a second solder bump.

2. The method of claim 1 further comprising, after the step of lifting the second work piece up and before the step of lowering the temperature of the heating head, blocking a vertical movement of the first work piece.

3. The method of claim 2 further comprising, after the step of blocking the vertical movement of the first work piece, continuing lifting up the second work piece.

4. The method of claim 1 further comprising, before the step of attaching the second work piece, placing the first work piece in a jig-type substrate carrier comprising a body further comprising a work piece holder, wherein the first work piece is placed in the work piece holder, and wherein the jig-type substrate carrier comprises blocking arms extending directly over an edge portion of the first work piece.

5. The method of claim 4, wherein the jig-type substrate carrier comprises a plurality of work piece holders.

6. The method of claim 4, wherein the jig-type substrate carrier further comprises a cover comprising an opening, wherein a horizontal dimension of the first work piece is smaller than a respective horizontal dimension of the work piece holder, and is greater than a respective horizontal dimension of the opening.

7. The method of claim 6, wherein a horizontal dimension of the second work piece is smaller than the respective horizontal dimension of the opening.

8. A method comprising:
providing a jig-type substrate carrier comprising a plurality of work piece holders;
placing a plurality of first work pieces into the plurality of work piece holders, wherein edge portions of the plurality of first work pieces are directly under and vertically overlap blocking arms of the jig-type substrate carrier;
placing a plurality of second work pieces over the plurality of first work pieces, with solder bumps joining the plurality of second work pieces to the plurality of first work pieces;
reflowing the solder bumps;
after the solder bumps melt, lifting up the plurality of second work pieces with the solder bumps in a melting state, wherein the plurality of first work pieces is lifted up to hang under the plurality of second work pieces, and wherein the jig-type substrate carrier is not lifted up; and
lowering a temperature of the solder bumps to below a melting temperature of the solder bumps.

9. The method of claim 8, wherein the plurality of first work pieces hangs under the plurality of second work pieces during an entire period of the step of lowering the temperature of the solder bumps.

10. The method of claim 8 further comprising, after the step of placing the plurality of first work pieces into the plurality of work piece holders, securing a cover of the jig-type substrate carrier over a body of the jig-type substrate carrier, with the plurality of work piece holders being parts of the body, wherein portions of the cover act as the blocking arms.

11. The method of claim 8 further comprising, after the step of lifting up the plurality of second work pieces and before the step of lowering the temperature of the solder bumps, blocking a vertical movement of the plurality of first work pieces using the blocking arms.

12. The method of claim 11 further comprising, after the step of blocking the vertical movement of the plurality of first work pieces, continuing lifting up the plurality of second work pieces.

13. The method of claim 8, wherein the steps of reflowing the solder bumps, lifting up the plurality of second work pieces, and lowering the temperature of the solder bumps are performed using a multi-head heating tool comprising a plurality of heating heads, with each of the plurality of heating heads contacting one of the plurality of second work pieces.

14. A method comprising:
providing a body of a jig-type substrate carrier comprising a plurality of work piece holders;
placing a plurality of first work pieces into the plurality of work piece holders;
attaching a plurality of second work pieces onto the plurality of first work pieces, with solder bumps joining the plurality of second work pieces to the plurality of first work pieces;
placing a cover of the jig-type substrate carrier onto the body of the jig-type substrate carrier, wherein the cover comprises blocking arms extending directly over, and contacting, edges of the plurality of first work pieces;
placing a plurality of heating heads over, and reflowing, the solder bumps, wherein each of the plurality of heating heads contacts one of the plurality of second work pieces;
reflowing the solder bumps by using the plurality of heating heads to heat the solder bumps;
after the solder bumps melt, releasing the plurality of second work pieces from the plurality of heating heads; and
after the step of releasing, lifting up the plurality of second work pieces using the plurality of heating heads, with the solder bumps in a melted state.

15. The method of claim 14 further comprising, after the step of lifting up the plurality of second work pieces, lowering a temperature of the solder bumps to below a melting temperature of the solder bumps.

16. The method of claim 14, wherein during the step of lifting up the plurality of second work pieces, the plurality of first work pieces is not lifted up.

17. The method of claim 14, wherein a time interval between the step of releasing the plurality of second work pieces and the step of lifting up the plurality of second work pieces is between about 1 second and about 2 seconds.

18. The method of claim 14, wherein during a time interval between the step of releasing the plurality of second work pieces and the step of lifting up the plurality of second work pieces, the plurality of first work pieces is allowed to move freely without being blocked.

* * * * *